(12) United States Patent
Manninen et al.

(10) Patent No.: US 10,451,354 B2
(45) Date of Patent: Oct. 22, 2019

(54) COOLING APPARATUS WITH MULTIPLE PUMPS

(71) Applicant: ABB Schweiz AG, Baden (CH)

(72) Inventors: Jorma Manninen, Vantaa (FI); Timo Koivuluoma, Vantaa (FI)

(73) Assignee: ABB Schweiz AG, Baden (CH)

( * ) Notice: Subject to any disclaimer, the term of this patent is extended or adjusted under 35 U.S.C. 154(b) by 268 days.

(21) Appl. No.: 15/194,152

(22) Filed: Jun. 27, 2016

(65) Prior Publication Data

US 2017/0003083 A1 Jan. 5, 2017

(30) Foreign Application Priority Data

Jun. 30, 2015 (EP) ..................................... 15174490

(51) Int. Cl.
*F28D 15/02* (2006.01)
*H01L 23/427* (2006.01)
(Continued)

(52) U.S. Cl.
CPC .......... *F28D 15/025* (2013.01); *F04B 19/006* (2013.01); *F28D 1/024* (2013.01);
(Continued)

(58) Field of Classification Search
CPC ............... F28F 2250/08; F28F 2260/02; F28F 2260/00; F28D 1/0226; F28D 15/025; F28D 15/0258; F28D 15/0266; F28D 2015/0216; F28D 15/02; F28D 2021/0028; F28D 2021/0066; F28D 1/05316; F28D 1/05366; F28D 1/05391; H01L 23/427; H05K 7/20327; H05K 7/20309; H05K 7/20318; H05K 7/20336
See application file for complete search history.

(56) References Cited

U.S. PATENT DOCUMENTS 3,205,938 A * 9/1965 Robinson .............. F28D 1/0316
165/108
3,682,239 A * 8/1972 Abu-Romia .......... F28D 15/025
165/104.26
(Continued)

FOREIGN PATENT DOCUMENTS

CN 1643327 A 7/2005
CN 1936481 A 3/2007
(Continued)

OTHER PUBLICATIONS

European Search Report, EP15174490, dated Dec. 15, 2015, ABB Technology Oy, 2 pages.
(Continued)

*Primary Examiner* — Jianying C Atkisson
*Assistant Examiner* — Jose O Class-Quinones
(74) *Attorney, Agent, or Firm* — Taft Stettinius & Hollister LLP; J. Bruce Schelkopf

(57) ABSTRACT

A cooling apparatus is disclosed with a base plate for receiving a heat load from an electric component, an evaporator, a condenser, and a connecting piece for passing fluid from the evaporator to the condenser. In order to efficiently fill the evaporator, the cooling apparatus is provided with a pump for pumping fluid from the condenser to the evaporator.

21 Claims, 2 Drawing Sheets

(51) Int. Cl.
*H05K 7/20* (2006.01)
*F04B 19/00* (2006.01)
*F28D 1/02* (2006.01)
*F28D 1/03* (2006.01)
*F28F 3/02* (2006.01)
*F28F 13/06* (2006.01)
*H01L 23/467* (2006.01)

(52) U.S. Cl.
CPC ......... *F28D 1/0226* (2013.01); *F28D 1/0358* (2013.01); *F28D 15/0266* (2013.01); *F28F 3/025* (2013.01); *F28F 13/06* (2013.01); *H01L 23/427* (2013.01); *H05K 7/20309* (2013.01); *H05K 7/20327* (2013.01); *F28D 2015/0216* (2013.01); *F28F 2250/08* (2013.01); *H01L 23/467* (2013.01)

(56) References Cited

U.S. PATENT DOCUMENTS

| | | | | |
|---|---|---|---|---|
| 4,220,195 A * | 9/1980 | Borgoyn | ............... | F28D 15/04 165/104.23 |
| 4,366,857 A * | 1/1983 | Mayer | ............... | F28D 15/02 165/104.23 |
| 4,381,463 A * | 4/1983 | Branover | ............... | H02K 44/085 310/11 |
| 5,729,995 A * | 3/1998 | Tajima | ............... | F28D 15/0266 165/104.21 |
| 5,884,693 A * | 3/1999 | Austin | ............... | A61B 8/546 165/104.22 |
| 5,901,037 A * | 5/1999 | Hamilton | ............... | F28F 3/12 165/80.4 |
| 5,998,863 A * | 12/1999 | Kobayashi | ............... | F28D 15/0266 165/104.33 |
| 6,005,772 A * | 12/1999 | Terao | ............... | F28D 15/0233 165/104.21 |
| 6,360,814 B1 * | 3/2002 | Tanaka | ............... | F28D 15/0266 165/104.21 |
| 6,745,830 B2 | 6/2004 | Dinh | | |
| 7,870,893 B2 * | 1/2011 | Ouyang | ............... | H01L 23/473 165/104.31 |
| 2003/0136555 A1 | 7/2003 | Dinh | | |
| 2004/0234392 A1 * | 11/2004 | Ghoshal | ............... | F04B 17/044 417/410.1 |
| 2005/0139345 A1 | 6/2005 | Pokharna et al. | | |
| 2005/0139354 A1 | 6/2005 | Salamat | | |
| 2005/0274496 A1 * | 12/2005 | Ishii | ............... | F25B 23/006 165/104.26 |
| 2007/0068654 A1 | 3/2007 | Chang | | |
| 2007/0284090 A1 | 12/2007 | Wu et al. | | |
| 2009/0056916 A1 * | 3/2009 | Yesin | ............... | F28D 1/05383 165/104.21 |
| 2011/0127011 A1 * | 6/2011 | Agostini | ............... | F28D 15/0266 165/104.21 |
| 2013/0301212 A1 * | 11/2013 | Yang | ............... | H01L 23/3672 361/679.47 |
| 2014/0116653 A1 * | 5/2014 | Lange | ............... | F21V 29/006 165/104.21 |

FOREIGN PATENT DOCUMENTS

| | | |
|---|---|---|
| CN | 101090625 A | 12/2007 |
| CN | 103517620 A | 1/2014 |
| CN | 203872485 U | 10/2014 |
| DE | 202014000176 U1 | 3/2014 |
| EP | 2677261 A1 | 12/2013 |

OTHER PUBLICATIONS

European Written Opinion, EP15174490, dated Dec. 15, 2015, ABB Technology, pages.

Chinese Office Action dated Jan. 29, 2018; Chinese Application No. 201610465070.3; ABB Technology Oy; 11 pgs. (including translation).

* cited by examiner (12)

COOLING APPARATUS WITH MULTIPLE PUMPS

BACKGROUND OF THE INVENTION

Field of the Invention

This invention relates to a cooling apparatus and in particular to an apparatus providing cooling for electric components.

Description of Prior Art

Previously there is known a cooling apparatus with a base plate receiving an electric component. An evaporator is in thermal contact with the base plate in order to pass a heat load from the electric component and the base plate into a fluid. A condenser receives fluid from the evaporator and dissipates heat from the fluid to surroundings.

A drawback with the known cooling apparatus is that different parts of the base plate receive different amounts of cooling. One reason for this is that the amount of fluid present in the evaporator is not sufficient. Therefore a part of the evaporator channel is practically dry. This dry part of the evaporator is not capable of passing the heat load to fluid in the evaporator channel as efficiently as those parts of the evaporator where the evaporator channel which completely filled with fluid.

Due to unsufficient cooling, it is not possible to arrange electric components requiring efficient cooling at any location on the surface of the base plate. Instead consideration is needed in order to determine where on the base plate such electric components may be arranged.

SUMMARY OF THE INVENTION

An object of the present invention is to solve the above mentioned drawback and to provide a cooling apparatus which more efficiently than previously provides adequate cooling to electric components. This object is achieved with the cooling apparatus of independent claim 1.

The use of a pump in a cooling apparatus for pumping fluid from the condenser to the evaporator ensures that a sufficient amount of fluid is always present in the evaporator in order to avoid that the evaporator channel partly dries out.

Preferred embodiments of the invention are disclosed in the dependent claims.

BRIEF DESCRIPTION OF DRAWINGS

In the following the present invention will be described in closer detail by way of example and with reference to the attached drawings, in which.

DESCRIPTION OF AT LEAST ONE EMBODIMENT

Figure 1:
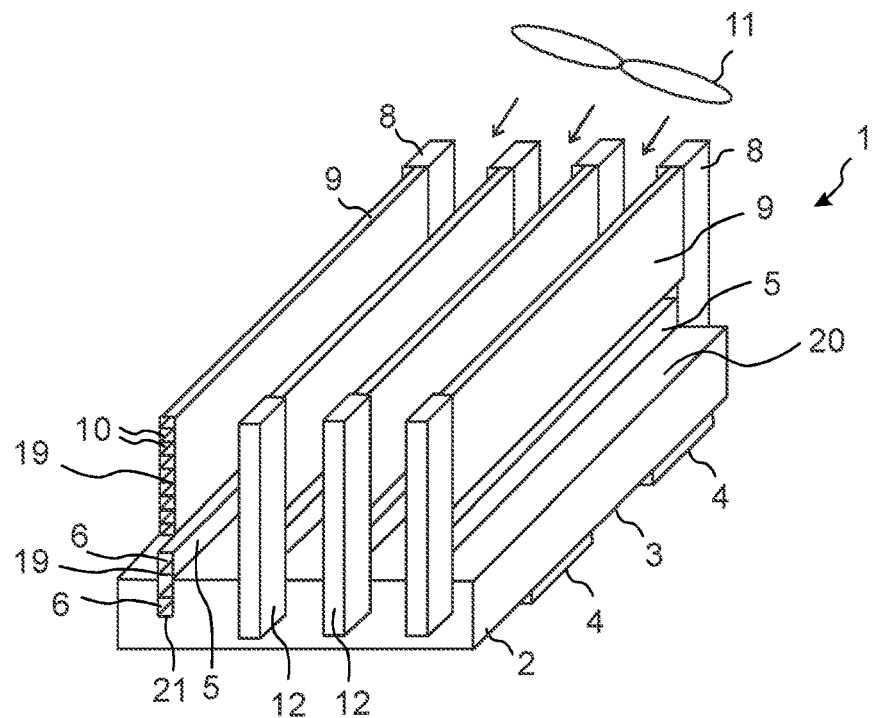
FIGS. 1 and 2 illustrate a first embodiment of a cooling apparatus.
Figure 2:
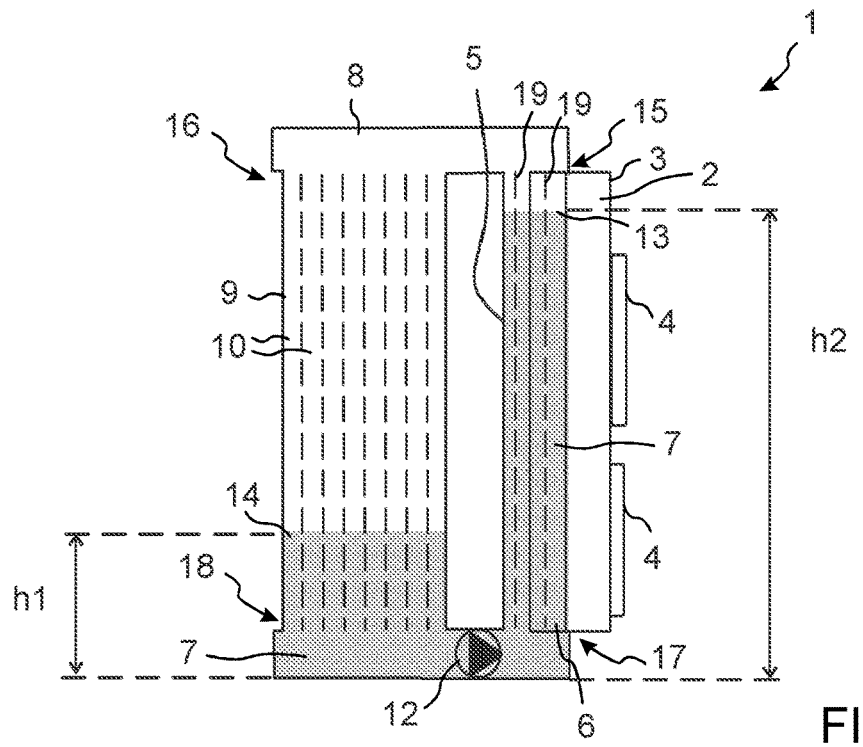

FIGS. 1 and 2 illustrate a first embodiment of a cooling apparatus 1. FIG. 1 is a bottom view of the cooling apparatus and FIG. 2 is a side view of the cooling apparatus, where also the pump and the fluid is illustrated.

Figure 4:
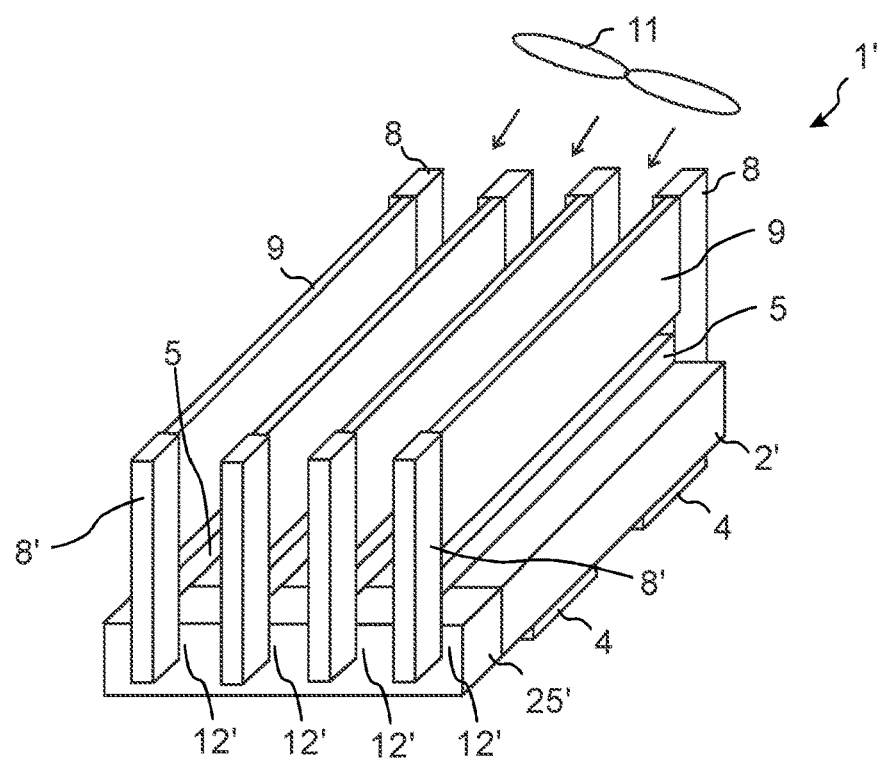
FIG. 4 illustrates a second embodiment of a cooling apparatus.

The cooling apparatus 1 is a two-phase cooling apparatus comprising a base plate 2 with a first surface 3 for receiving a heat load from an electric component 4. Two-phase cooling refers to a solution where heat is transferred from one part of the apparatus to another by vaporizing a liquid fluid at a hot part of the apparatus and by condensing the fluid back to a liquid at a cold part of the system. In FIG. 4 two electric components are shown attached to the first surface 3 of the base plate. It should be observed that though the figures by way of example illustrate an embodiment where the heat load from the electric components is received via the first surface, it is also possible that in some embodiments a part or all of the electric components are embedded into the base plate. In that case only a part of the heat load or no heat load at all is received via the first surface.

The illustrated cooling apparatus 1 also comprises an evaporator 5 with an evaporator channel 6 which has a thermal contact with the base plate 2. The heat load received via the first surface 3 of the base plate is passed into fluid 7 located in the evaporator channel 6. The used fluid may be R134a (2.2-Dichloro-1,1,1-trifluoroethane), ethanol, or water, for instance.

The evaporator 5 is connected via a connecting piece 8 in the upper end of the cooling apparatus to a condenser 9. Fluid 7 which has evaporated in the evaporator 5 is passed as vapour via the connecting piece 8 to the condenser channel 10 of the condenser 9. A part of the fluid passed from the evaporator to the condenser may still be in a liquid state. The condenser 9 dissipates heat from the received fluid 7. In the illustrated example this dissipation is by way of example carried out into the surrounding air though in some implementations the dissipation may be carried out into a liquid. In order to make the dissipation more efficient the cooling apparatus may be provided with a fan 11 which generates an airflow that passes along the outer surface of the condenser 9. The direction of the airflow may be from the top to the bottom of the cooling apparatus as illustrated by arrows in FIG. 1, or alternatively from the bottom towards the top. The condenser 9 may be manufactured as an elongated plate shaped element having relatively large side surfaces working as fins that efficiently dissipate heat into the surrounding air, as illustrated in FIG. 1, for instance. Additionally or as an alternative, other fins may be used. It should also be observed that the specific design of the condenser is case specific and that the surface geometry (fins) and internal channel design may depend on the properties of the fluid used in the apparatus, the fluid (liquid or gas, such as air) into which dissipation is carried out, the operating temperatures and other conditions.

Condensed fluid 7 in the lower part of the condenser 9 is passed as liquid via a pump 12 to the evaporator 5. Due to the pump it can be ensured that a sufficient amount of fluid 7 is always present in the evaporator 5 in order to avoid that the evaporator channel 6 dries out. Therefore adequate cooling is provided to electric components 4 present on the first surface 3 of the base plate 2 or embedded into the base plate irrespectively in which part of the base plate the electric component is arranged.

In the illustrated example where the cooling apparatus 1 is arranged in such a position that the evaporator channel 6 and the condenser channel 10 are both arranged to extend in the vertical direction, gravity would normally cause the upper surface 13 of the fluid 7 in the evaporator channel 6 to be approximately on the same level with the upper surface 14 of the fluid 7 in the condenser channel 10. In that case the upper part of the evaporator channel would dry out, and the cooling provided on the upper part of the base plate 2 would therefore be insufficient. However, due to the pump 12 this is not the case, as illustrated in FIG. 2.

In the illustrated embodiment the pump 12 ensures a sufficient pressure raise on the evaporator side of the pump to ensure that the evaporator channel remains sufficiently filled. Consequently the fluid 7 level can be maintained at a height h2 in the evaporator 5, while the fluid 7 level remains on a lower height h1 in the condenser 5. This is an advantage also for the condenser, because in that case the part of the condenser 5 which is filled with fluid in a liquid state can be minimized and therefore the dry part of the condenser where fluid condensing from vapor to liquid occurs can be maximized. Due to the pump, the illustrated cooling apparatus can be used also in other orientations than in the illustrated upright position, as the pump ensures suitable fluid distribution between the evaporator and condenser.

In the illustrated example the upper end 15 of the evaporator 5 and the upper end 16 of the condenser 9 are located substantially on a same height with each other, and a lower end 17 of the evaporator 5 and a lower end 18 of the condenser 9 are located substantially on a same height with each other. This results in a cooling apparatus which is very compact, as the evaporator and condenser can be on the same level, which reduces the size (height) of the cooling apparatus in the vertical direction.

In the illustrated example the evaporator 5 and the condenser 9 are both, by way of example, implemented as a respective tube with longitudinal internal walls 19 separating a plurality of evaporator channels 6 and condenser channels 10, respectively, from each other. Also other types of tubes may, however, be utilized. The illustrated tubes may be implemented with MPE pipes (Multi-Port Extruded) produced by extrusion of aluminum, for instance. The second surface 20 of the base plate 2, which is an opposite surface as compared to the first surface 3, may be provided with a groove 21 into which the evaporator 5 at least partly protrudes. In this way one or more of the evaporator channels 6 are located within the base plate 2, which ensures an excellent thermal contact between the evaporator 5 and the base plate 2.

In order to ensure adequate cooling for the entire base plate 2, the illustrated cooling apparatus comprises a plurality of parallel evaporators 5 with respective evaporator channels 6, and also a plurality of parallel condensers 9 with a plurality of parallel condenser channels 10. Each evaporator—condenser pair may have an own connecting piece 8 in the upper end of the cooling device, as illustrated in the figures. Alternatively, one single manifold may be used in the upper end of the cooling apparatus, in which case this manifold provides fluid communication between all existing evaporator channels and condenser channels present in the cooling apparatus.

In the illustrated example it has by way of example been assumed that each evaporator—condenser pair have an own pump 12 in the lower end of the cooling device 1. In FIG. 1, however, the pump 12 which should be located most to the left has been removed in order to show the evaporator channels 6 and the condenser channels 10 of this evaporator—condenser pair.

Instead of having an own pump 12 for each evaporator—condenser pair, as illustrated in FIG. 1, one single pump may be used. In that case a condenser manifold connecting all condenser channels 10 to each other at the lower end of the cooling apparatus and an evaporator manifold connecting all condenser channels to each other at the lower end of the cooling apparatus may be used. In that case the single pump 12 transfers fluid from the condenser manifold to the evaporator manifold.

In order to avoid using a traditional mechanical pump, the pump 12 is preferably a pump generating an electric or mechanic field for pumping the fluid with said field. Several alternative types of such non-mechanic pumps exist, such as electro-hydrodynamic (EHD) pumps, electro-kinetic pumps and magneto-hydrodynamic (MHD) pumps.

Figure 3:
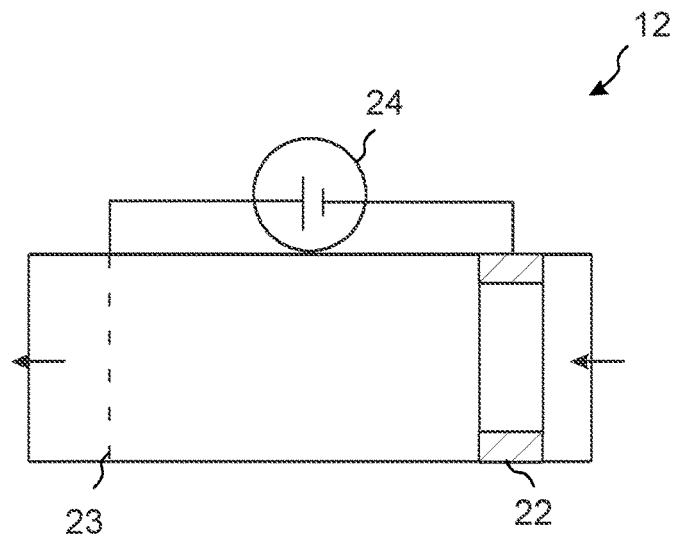
FIG. 3 illustrates an electro-hydrodynamic pump.

FIG. 3 illustrates an electro-hydrodynamic pump 12 which may be utilized in the embodiment of FIGS. 1 and 2.

The illustrated pump includes first electrode 22 shaped as a ring and a second electrode 23 which may be implemented as a perforated plate or net, for instance. A power source 24 is used for generating an electric field between the first 22 and second 23 electrode. Fluid molecules near the first electrode 22 become ionized due to the electric field and travel toward the second electrode 23. During travel, the momentum from the ionized fluid molecules is transferred to surrounding fluid due to collisions between the ionized fluid molecules and the neutral fluid molecules. This results in a fluid flow where the fluid flows from the condenser towards the evaporator.

FIG. 4 illustrates a second embodiment of a cooling apparatus. The embodiment of FIG. 4 is very similar as the embodiment of FIGS. 1 and 2. Therefore the embodiment of FIG. 4 is in the following explained mainly by pointing out the differences between these embodiments.

In FIG. 4 the pumps 12' are differently located as compared to the embodiment of FIGS. 1 and 2. Fluid in a liquid state exiting the condensers 9 is passed into second connecting pieces 8' which are located in the lower ends of the cooling apparatus. The connecting pieces 8' may be similarly implemented as the connecting pieces 8 in FIG. 1, such as by plain tube sections providing fluid communication between the condenser and evaporator channels. A pump section 25' containing a plurality of pumps 12' is arranged as an extension of the base plate 2' in the lower part of the cooling apparatus. This pump section 25' may contain one pump 12' of the type illustrated in FIG. 3, for instance, for each evaporator 5—condenser 9 pair.

It is to be understood that the above description and the accompanying figures are only intended to illustrate the present invention. It will be obvious to a person skilled in the art that the invention can be varied and modified without departing from the scope of the invention.

The invention claimed is:

1. A cooling apparatus comprising:
a base plate for receiving a heat load from an electric component,
a plurality of parallel evaporators having respective evaporator channels having a thermal contact with the base plate for passing the received heat load to fluid in the plurality of parallel evaporator channels,
one or more of the respective evaporator channels are located within the base plate,
a plurality of parallel condensers with condenser channels each receiving the fluid from one of the evaporators and for dissipating heat from the received fluid, and
a plurality of connecting pieces each passing the fluid from one evaporator to one condenser,
the evaporator channels and the condenser channels both extend in the vertical direction, wherein
the cooling apparatus is provided with a plurality of pumps pumping the fluid from one condenser to one evaporator, and
the plurality of pumps configured to maintain the fluid level at a height in the evaporator, while the fluid level remains at a lower height in the condenser, for cooling the entire base plate.

2. The cooling apparatus according to claim 1, wherein each of the plurality of pumps generates an electric field or magnetic field for pumping the fluid by said field.

3. The cooling apparatus according to claim 1, wherein each of the plurality of pumps comprises a first electrode and a second electrode arranged at a distance from each other, and a power source for generating an electrical field between the first and second electrode.

4. The cooling apparatus according to claim 2, wherein each of the plurality of pumps comprises a first electrode and a second electrode arranged at a distance from each other, and a power source for generating an electrical field between the first and second electrode.

5. The cooling apparatus according to claim 1, wherein an upper end of each one of the plurality of parallel evaporators and an upper end of each one of the plurality of parallel condensers are located substantially on a same height with each other, and a lower end of each one of the plurality of parallel evaporators and a lower end of each one of the plurality of parallel condensers are located substantially on a same height with each other.

6. The cooling apparatus according to claim 2, wherein an upper end of each one of the plurality of parallel evaporators and an upper end of each one of the plurality of parallel condensers are located substantially on a same height with each other, and a lower end of each one of the plurality of parallel evaporators and a lower end of each one of the plurality of parallel condensers are located substantially on a same height with each other.

7. The cooling apparatus according to claim 3, wherein an upper end of each one of the plurality of parallel evaporators and an upper end of each one of the plurality of parallel condensers are located substantially on a same height with each other, and a lower end of each one of the plurality of parallel evaporators and a lower end of each one of the plurality of parallel condensers are located substantially on a same height with each other.

8. The cooling apparatus according to claim 1, wherein each one of the plurality of parallel evaporators consists of a tube with longitudinal internal walls separating a plurality of evaporator channels from each other, and
the base plate comprises a second surface which is provided with grooves into which a respective one of said tubes is arranged.

9. The cooling apparatus according to claim 2, wherein each one of the plurality of parallel evaporators consists of a tube with longitudinal internal walls separating a plurality of evaporator channels from each other, and
the base plate comprises a second surface which is provided with grooves into which a respective one of said tubes is arranged.

10. The cooling apparatus according to claim 3, wherein each one of the plurality of parallel evaporators consists of a tube with longitudinal internal walls separating a plurality of evaporator channels from each other, and
the base plate comprises a second surface which is provided with grooves into which a respective one of said tubes is arranged.

11. The cooling apparatus according to claim 4, wherein each one of the plurality of parallel evaporators consists of a tube with longitudinal internal walls separating a plurality of evaporator channels from each other, and
the base plate comprises a second surface which is provided with grooves into which a respective one of said tubes is arranged.

12. The cooling apparatus according to claim 1, wherein each one of the plurality of parallel condensers consists of a tube with longitudinal internal walls separating a plurality of condenser channels from each other.

13. The cooling apparatus according to claim 2, wherein each one of the plurality of parallel condensers consists of a tube with longitudinal internal walls separating a plurality of condenser channels from each other.

14. The cooling apparatus according to claim 3, wherein each one of the plurality of parallel condensers consists of a tube with longitudinal internal walls separating a plurality of condenser channels from each other.

15. The cooling apparatus according to claim 4, wherein each one of the plurality of parallel condensers consists of a tube with longitudinal internal walls separating a plurality of condenser channels from each other.

16. The cooling apparatus according to claim 5, wherein each one of the plurality of parallel condensers consists of a tube with longitudinal internal walls separating a plurality of condenser channels from each other.

17. The cooling apparatus according to claim 6, wherein each one of the plurality of parallel condensers consists of a tube with longitudinal internal walls separating a plurality of condenser channels from each other.

18. The cooling apparatus according to claim 1, wherein the apparatus comprises a fan for generating an airflow passing along an outer surface of each one of the plurality of parallel condensers.

19. The cooling apparatus according to claim 2, wherein the apparatus comprises a fan for generating an airflow passing along an outer surface of each one of the plurality of parallel condensers.

20. The cooling apparatus according to claim 3, wherein the apparatus comprises a fan for generating an airflow passing along an outer surface of each one of the plurality of parallel condensers.

21. The cooling apparatus according to claim 4, wherein the apparatus comprises a fan for generating an airflow passing along an outer surface of each one of the plurality of parallel condensers.

* * * * *